Aug. 2, 1960

R. M. TROSTLER 2,947,913

GAS TUBE SWITCH

Filed Dec. 27, 1956

2 Sheets-Sheet 1

RICHARD M. TROSTLER,
INVENTOR.

By Walter J. Jason
ATTORNEY.

Aug. 2, 1960 R. M. TROSTLER 2,947,913

GAS TUBE SWITCH

Filed Dec. 27, 1956 2 Sheets-Sheet 2

RICHARD M. TROSTLER,
INVENTOR.

By [signature]
ATTORNEY.

United States Patent Office 2,947,913

Patented Aug. 2, 1960

2,947,913

GAS TUBE SWITCH

Richard M. Trostler, Pomona, Calif., assignor to General Dynamics Corporation, San Diego, Calif., a corporation of Delaware Filed Dec. 27, 1956, Ser. No. 630,917

4 Claims. (Cl. 315—238)

This invention relates generally to electronic switching; more particularly it relates to electronic switching involving the use of ionizable gas as a switching means.

Heretofore, in the switching of signal voltages, both mechanical relays and non-linear electronic device have been utilized. Each of these types of equipment has certain inherent disadvantages. Mechanical relays require moving parts with their attendant environmental limitations, unpredictability, and high cost. Among the environmental limitations are erratic operation caused by vibration and acceleration. These may produce undesired operation or may prevent desired operation of the relay. Relays have the additional defect of uncertainty in the amount of contact resistance when the signal level is so low as to be unable to break through the surface film between the contacts. Mechanical switching is characterized by inertial time lag, which limits the speed of switching and introduces phase lag in periodic switching. This phase lag increases as a function of frequency.

The use of non-linear electronic devices, such as vacuum tubes and crystal rectifiers, in switching has also presented considerable difficulty. Circuitry utilizing these components tends to become complex because transformers and certain other components are employed. Crystal diodes or vacuum tubes introduce extraneous signals in the process of switching. The useful range of operation is thereby lowered. In the use of crystal diodes or vacuum tubes, electronic switch arrangements are provided which attempt to cancel switching voltages from the signal.

However, complete cancellation is practically impossible and some of the extraneous switching signals are introduced into the signal circuit. The extraneous signals consist of the A.-C. components of the switching signals and of D.-C. components generated by the switching device itself, in the case of vacuum tubes. The D.-C. components may be inherent in the unbalance of the circuit.

It is, therefore, an object of the present invention to perform the function of switching while substantially isolating the switching circuit from the signal circuit.

It is an object of the present invention to provide an electronic switch characterized by a high order of signal to noise ratio.

It is an object of the present invention to provide an electronic switch capable of switching signal voltages of low magnitude, the extraneous signals entering the signal system being of a lower order of magnitude than in conventional electronic switches.

It is an object of the present invention to provide an electronic switch requiring no signal voltage to establish a signal conducting path.

Another object of the present invention is to provide an electronic switch having a very short switching time.

Another object of the present invention is to provide an electronic switch capable of operation at higher switching frequencies than are obtainable in the relay art.

It is another object of the present invention to provide an electronic switch utilizing a single excitation source for simultaneous switching of a plurality of isloated signals.

It is another object of the present invention to provide multiple switching apparatus requiring less space than conventional devices.

It is a further object of the present invention to accomplish electronic switching in such manner as to preserve many advantages of mechanical switching without incurring the inherent disadvantages thereof.

Other objects and features of the present invention will be readily apparent to those skilled in the art from a consideration of the following specification and the accompanying drawings in which.

Briefly described, electronic switching according to the present invention is accomplished by providing a gas tube in which a signal is applied across signal electrodes, and in which the gas between the signal electrodes is ionized to complete a signal circuit by the application of the output of an R.F. generator between excitation electrodes and the signal electrodes, the signal electrodes being so constructed and the impedances in the R.F. circuitry being such that the R.F. currents through the signal electrodes are equalized. This minimizes the introduction of extraneous D.-C. signal into the signal circuit by the switching circuit and provides substantial isolation of the signal circuitry from the switching circuitry.

Figure 1:
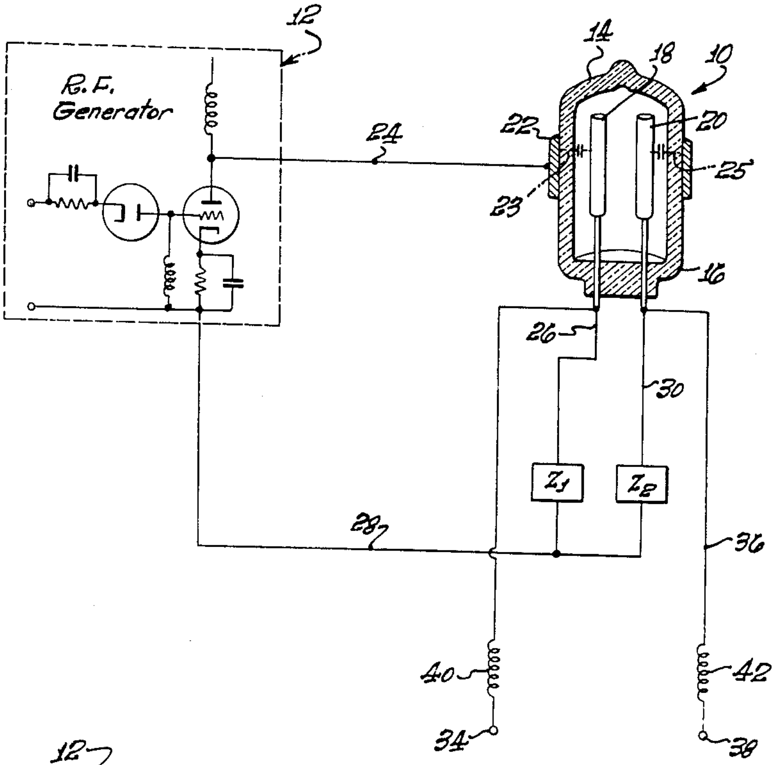
Figure 1 is a schematic drawing of an electronic switch according to the present invention.

Referring to the drawings, and particularly to Figure 1 thereof, there is shown a preferred embodiment of the gas tube switch of the present invention. A gas tube 10 is shown electrically connected to an R.F. generator 12. Glass envelope 14 of tube 10 encloses an ionizable gas. Tube 10 has a thickened base portion 16 which serves as a mounting for signal electrodes 18 and 20. External electrode 22 is connected by conductor 24 to R.F. generator 12. Electrode 22 is capacitively coupled to signal electrodes 18 and 20 as shown symbolically by phantom capacitors 23 and 25.

An R.F. circuit is formed by conductor 24, excitation electrode 22, signal electrode 18, conductor 26, impedance $Z_1$ and conductor 28. Similarly, an R.F. circuit is formed by conductor 24, excitation electrode 22, signal electrode 20, conductor 30, impedance $Z_2$, and conductor 28.

Signal lead or conductor 32 is connected to signal electrode 18 and terminates in signal connection 34. Signal lead or conductor 36 is connected to signal electrode 20 and terminates in signal connection 38. A circuit for a signal applied across connections 34 and 38 is formed by conductor 32, signal electrode 18, the gas between signal electrodes 18 and 20 (when the gas is ionized), signal electrode 20 and conductor 36. An R.F. choke 40 in signal lead 32 and an R.F. choke 42 in signal lead 36 are provided to prevent the introduction of R.F. current into external signal circuitry to be connected across connections 34 and 38. The importance of R.F. chokes 40 and 42 is hereinafter discussed. The relative values of capacitances 23 and 25 may be controlled externally. One method is to rotate a metal clip clamped over the tube to a position where they are equal. Another method is to apply a strip of conductive paint to the surface of the tube and scrape the paint from appropriate areas until the capacitances are equal.

Referring again to Figure 1, impedances $Z_1$ and $Z_2$ will be observed to be in series between signal leads 32 and 36. The series combination of impedances $Z_1$ and $Z_2$ is in parallel with the signal circuit through signal electrodes 18 and 20. Impedances $Z_1$ and $Z_2$ have such capacitive components that in series they present such high impedance to the signal frequencies that the signal frequencies are effectively blocked. The signal must, therefore, take the path through the ionized gas between signal electrodes 18 and 20.

The signal circuit to be connected to connections 34 and 38 is closed by applying R.F. excitation between excitation electrode 22 and signal electrodes 18 and 20. With the application of R.F. excitation of sufficient potential, the gas between signal electrodes 18 and 20 will become ionized, thereby completing the signal circuit. It is desirable that the impedance of the ionized gas between signal electrodes 18 and 20 be minimized in order to reduce the effective "contact" resistance. In order to accomplish this, electrodes 18 and 20 may be disposed in closely spaced relation and they may be provided with large confronting areas. Signal electrodes 18 and 20 are shown in Figure 1 as having cylindrical configurations, because a cylinder or rod is a convenient and conventional form. Specially designed electrodes may be provided, such as plates in confronting relationship. Other factors affecting the nature of signal electrodes 18 and 20 are set forth later herein.

Important requirements of a switch are that it establish a signal conducting path when desired and that it not introduce switch-generated extraneous voltages into the signal circuit. It is characteristic of a gas tube that if the two electrodes between which current is flowing do not have equal areas and identical work functions, higher impedance is presented to the passage of current between them in one direction than in the other direction. A rectifying action will take place and a D.C. voltage will be produced. Means must be provided to cancel it. If the same D.C. voltage is generated at each signal electrode (18, 20) with respect to the excitation electrode (22), then the difference in potential between the two signal electrodes is zero and the requirements of a switch are met.

A principal feature of the present invention is the provision of a higher degree of isolation of the signal circuit from the switching circuit than is obtainable through the use of presently known electronic switches. The introduction into the signal circuitry of extraneous signals from the switching circuit is minimized. In the embodiment of the present invention shown in Figure 1, the extraneous signal which would be introduced into the signal circuit by the gas tube switch would be produced as a result of the production of a net effective D.C. voltage between signal electrodes 18 and 20 during the operation of the gas tube switch. This would introduce D.C. into the external signal circuitry. It has been found that the production of such a net effective D.C. voltage can be greatly reduced or eliminated by providing that the magnitude of the R.F. excitation current flowing through one signal electrode be equal to the magnitude of the R.F. current which flows through the other signal electrode. A net effective D.C. voltage is produced between the two signal electrodes if there is an unbalance between the excitation currents flowing through the two signal electrodes.

One possible explanation for the production of net effective D.C. voltage between the signal electrodes is the theory which will now be presented. The voltage at the signal electrodes is alternately positive and negative because of the sinusoidal wave form of the R.F. excitation voltage. R.F. current passes through the ionized gas between signal electrodes 18 and 20 and the excitation electrode 22 by means of electrons and positive ions. When the signal electrodes are positive, electrons move to them quite freely. When the signal electrodes are negative, positive ions move to them, but their movements are more restricted than those of electrons. One reason for this is the great difference in mobility between a positive ion and an electron, resulting from the much greater mass and size of a positive ion. Because of their larger size, positive ions are more impeded in their passage by neutral atoms. As positive ions reach the negative signal electrodes, they acquire electrons and become neutral atoms. Some of these atoms tend to linger in the region of the electrodes and thereby tend further to impede the passage of positive ions to the electrodes. Because of the foregoing factors, positive ions tend to become concentrated in the regions of the signal electrodes during the periods when these electrodes are negative. A positive space charge is thereby produced in the vicinity of each signal electrode. The space charge means that the potential gradient adjacent to a signal electrode is much steeper when the electrode is negative that when it is positive, for a given R.F. current flow. This gradient represents most of the R.F. voltage drop between a signal electrode and the excitation electrode.

It thus becomes apparent that the greater the R.F. current through a signal electrode, the steeper will be the potential gradient in the region of that electrode when it is negative. If greater R.F. current flows through one signal electrode than through the other, a steeper voltage gradient will exist in the region of the electrode having the greater current. With the voltage of the excitation electrode as a reference, the different gradients mean that different voltage levels will exist at the two signal electrodes when they are negative. There is thus produced a difference of potential between signal electrodes 18 and 20 which pulsates in accordance with the sinusoidal wave form of the R.F. excitation. This pulsating difference of potential is stored in the capacitive components of impedances $Z_1$ and $Z_2$ and appears at signal connections 34 and 38 as an undesirable extraneous D.C. voltage. As hereinbefore stated, this D.C. voltage is minimized or substantially eliminated by providing identical signal electrodes and by adjusting the relative magnitudes of impedances $Z_1$ and $Z_2$ to equalize the R.F. currents through electrodes 18 and 20. Expressed in another manner, the R.F. bridge is balanced so that there is zero D.C. output to connections 34 and 38.

Equalizing of the R.F. currents through the signal electrodes is effected by the provision of proper signal electrodes and by appropriate selection of the components in impedances $Z_1$ and $Z_2$. Signal electrodes 18 and 20 are made of the same material, so that they have equal work functions. They have equal surface areas and similar configurations. The signal electrodes should have similar geometric relationships with the excitation electrode. Cylindrical signal electrodes are shown in all figures of the drawings for purposes of illustration only, and not by way of limitation.

It is important that impedances $Z_1$ and $Z_2$ be such that the R.F. current through signal electrode 18 is substantially equal to the R.F. current through signal electrode 20. It is believed that the magnitudes of impedances $Z_1$ and $Z_2$ are the important factors in this connection and that the nature of the impedances may be different. Impedances $Z_1$ and $Z_2$ thus perform two separate functions in the operation of the present invention. Separately, in the R.F. excitation circuit, each provides the proper impedance to equalize the R.F. currents through signal electrodes 18 and 20. They thereby prevent the introduction of extraneous D.C. voltage into the signal circuit from the R.F. energization circuit. In series across the signal circuit, they present such impedance to the signal in the signal circuit that they effectively prevent passage of this signal. With respect to the signal circuit, in other words, impedances $Z_1$ and $Z_2$ are in parallel with signal electrodes 18 and 20 and present such impedance as to prevent signal passage therethrough, causing signal passage only through the ionized gas between electrodes 18 and 20. Obviously, one or both of impedances $Z_1$ or $Z_2$ must have a capacitive component which presents a high impedance to the signal being switched and a relatively low impedance to the R.F. excitation current. The impedances are therefore frequency-selective couplings. The conduction path between signal electrodes 18 and 20 being in parallel with the series combination of impedances $Z_1$ and $Z_2$, as far as the signal circuit is concerned, only one of these impedances need be capacitive. However, the more general usage would be to provide capacitive components in both impedances.

To insure the equalizing of R.F. currents through the signal electrodes in the presence of external capacitances in the circuit in which the gas tube switch may be connected, tube electrodes 18 and 20 are connected to connections 34 and 38 through radio-frequency chokes 40 and 42. Chokes 40 and 42 prevent R.F. excitation current from passing into the external signal circuitry in the event external capacitances in the signal circuitry unbalance the excitation paths. These chokes also present a frequency selective coupling to the tube.

The switching frequency of the gas tube switch of the present invention is limited only by the de-ionization time of the particular gas which is used. Different gases have different ionization and de-ionization times as well as different ionization and de-ionization potentials. It is obvious that the signal voltage must not be so high as to ionize the gas in the gas tube.

Figure 2:
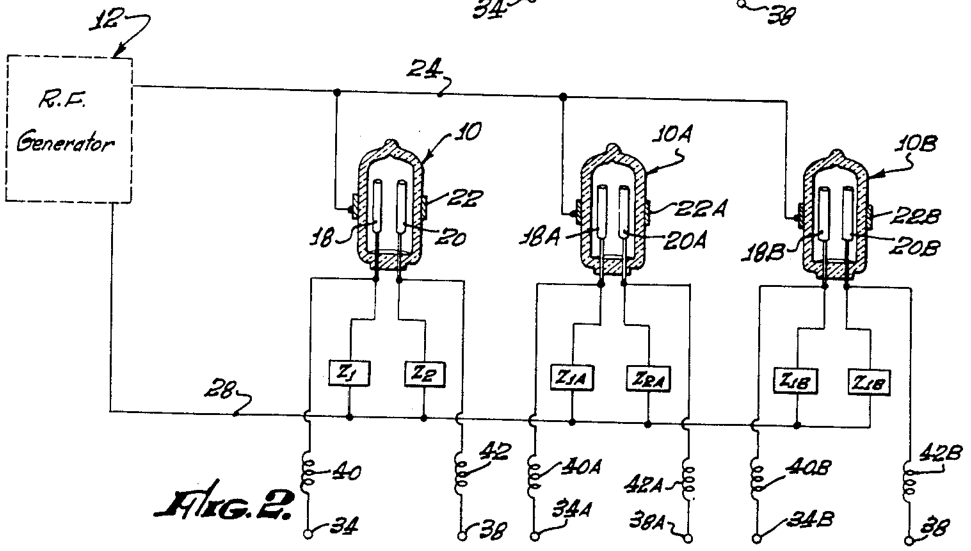
Figure 2 is a schematic diagram showing three electronic switches of the present invention arranged in parallel for multiple switching.

The gas tube switch is a versatile multichannel synchronous electronic switching device in which one excitation source will supply energy necessary to switch simultaneously a plurality of electrically independent circuits. In Figure 2 three gas tube switches 10, 10A and 10B of the present invention are shown arranged in parallel across a single R.F. excitation source 12. With the exception of the parallel connection of the tube switches to the excitation source, all components and circuitry are the same as described in connection with Figure 1. The first tube 10 and its associated circuitry have the same identification numerals as used in Figure 1 and the other switches have corresponding numerals followed by letters A or B. The tube resistances, the tube capacitances and the impedances may vary in magnitude among the tubes without detrimental effect. The switching frequency can vary from zero to over several thousand cycles per second with no phase shift between the switching frequency and the switching control voltage. The operation of the switches is not affected by moderate variations in amplitude in the energization source voltage so long as the voltage is above the ionization level of the tubes. Variations in frequency merely change the switching frequency but do not otherwise affect the switching characteristics of the tubes. Temperatures of −40° F. and +165° F. have no observable effect on the ionization pattern of the tubes. Because of the small size of the components and the simplicity of design, a plurality of switching units may be efficiently packaged. Space requirements are only one-fifth to one-third those of other equipment performing the function of the present invention.

Figure 3:
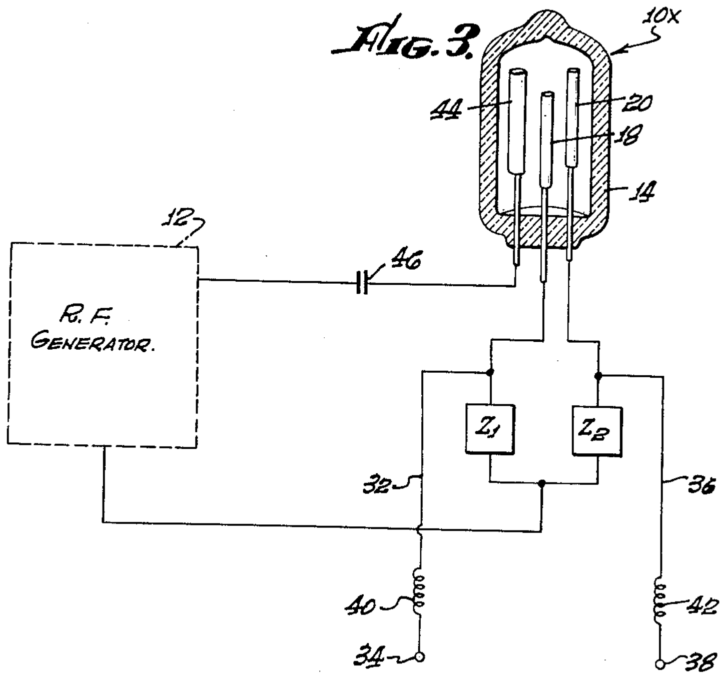
Figure 3 is a schematic drawing of a modified electronic switch of the present invention.

Referring to Figure 3, there is therein shown a modified gas tube switch 10X of the present invention. In this embodiment a third electrode 44 is shown mounted within the glass envelope, instead of external excitation electrode 22 of the embodiment shown in Figure 1. A low value coupling capacitor 46 between the tube and excitation source 12 is utilized in this modification to block any D.C. from the R.F. source to provide signal isolation and to control the R.F. current flow through the tube. Electrode 44 is constructed of the same material as signal electrodes 18 and 20 and has an area equal to the sum of the areas of the two signal electrodes. There should therefore be no rectifying action and hence no D.C. generated.

If, because of some inaccuracy, D.C. tended to be generated, it could be compensated by proper adjustment of impedances $Z_1$ and $Z_2$.

Figure 4:
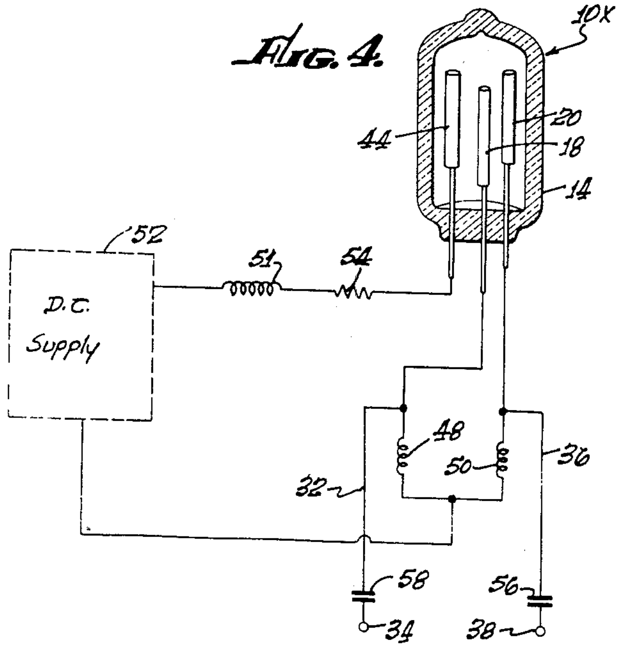
Figure 4 is an embodiment of the present invention adapted for switching R.F. signals.

In Figure 4 is shown an embodiment of the present invention which is adapted for the switching of R.F. signals. To insure that the R.F. signal will take the path through the ionized gas between signal electrodes 18 and 20, inductive impedances 48 and 50 are used instead of capacitive impedances $Z_1$ and $Z_2$, described above in connection with tubes excited by an R.F. excitation source. These impedances in series pass lower frequencies but block the higher R.F. frequency. The excitation source must be of a lower frequency, for which inductance 51 establishes the upper limit. D.C. supply source 52 may furnish either a steady state voltage or a voltage pulsating at a desired switching frequency. Resistance 54 determines the voltage value available to ionize the gas in tube 10X. The values of impedances 48 and 50 are so selected or adjusted that there is no D.C. between lines 32 and 36 produced by inequality between the current from electrode 44 to signal electrode 18 and the current from electrode 44 to electrode 20. Capacitors 56 and 58 prevent D.C. excitation energy from entering the external R.F. circuit being switched. They also prevent any extraneous D.C. or low frequencies in the external R.F. circuitry from affecting the functioning of signal electrodes 18 and 20. In this modification a D.C. bridge is balanced to a zero output.

Although certain preferred embodiments of the invention have been specifically disclosed, it is understood that the invention is not limited thereto as many variations will be readily apparent to those skilled in the art and the invention is to be given its broadest possible interpretation within the terms of the following claims:

I claim:

1. Switching apparatus comprising a sealed envelope having an ionizable gas therein, a pair of signal electrodes in spaced relation within said envelope, excitation electrode means carried by said envelope for capacitive coupling to said signal electrodes, a single source of radio-frequency excitation power connecting said excitation electrode means to said signal electrodes for ionizing said gas to complete a signal circuit between said signal electrodes, said radio-frequency excitation power being supplied independently of the signal circuit, and a separate impedance connected between each of said signal electrodes and said excitation source, said impedances having respective magnitudes capable of equalizing the excitation currents through said signal electrodes to minimize the generation of extraneous voltages therebetween, whereby very low signals and signals approaching the ionization potential are switched.

2. A gas tube switch for switching low frequency signals comprising a tube having an ionizable gas within the envelope thereof, a pair of signal electrodes in spaced relation within said tube, a signal circuit lead connected to each of said signal electrodes, an excitation electrode for capacitive coupling to said gas, a single external source of radio-frequency excitation having two terminals, one of said terminals being connected with said excitation electrode for ionizing said gas to provide a conducting path between said signal electrodes, and a pair of impedances connected one between each of said signal electrodes and the other terminal of said excitation source, said impedances having respective magnitudes capable of equalizing radio-frequency currents through said signal electrodes to substantially eliminate D.C. voltage generation between said signal electrodes by gas rectification, and said impedances having capacitive elements in parallel with said conducting gas path between the signal electrodes to present blocking series reactance to said signals.

3. A gas tube switch comprising a tube having an ionizable gas within the envelope thereof, a pair of signal electrodes in spaced relation within said tube, a signal circuit lead connected to each of said signal electrodes and to an external signal circuit, an excitation electrode for electrical coupling to said signal electrodes upon ionization of said gas, and a single source of R.F. excitation power having two terminals, one of said terminals being connected with said excitation electrode for ionizing said gas to provide a conducting path between said signal electrodes, a pair of impedances connected one between each of said signal electrodes and the other terminal of said excitation source and being adapted to balance the R.F. currents through the signal electrodes to eliminate extraneous voltages between the signal electrodes, said impedances being in parallel with said conducting path between the signal electrodes and presenting high series reactance to said signals, and an R.F. choke connected with each of the respective signal circuit leads to prevent unbalancing of said R.F. currents by said external signal circuit.

4. Balanced bridge means for preventing the introduction of extraneous voltages into a signal circuit connected to a gas tube, said bridge means comprising a gas tube having two signal electrodes therein, means for connecting said electrodes with a signal circuit having signals of predetermined frequencies, frequency-selective coupling means connecting said electrodes to said connection means for passing only said predetermined frequencies, a single external excitation source for supplying tube excitation voltage having a frequency other than said predetermined frequencies, a third electrode connected to said excitation source, impedance provided by the gas between said third electrode and each of said two electrodes, forming two legs of said bridge means, frequency selective impedances connected to said two signal electrodes and forming two legs of said bridge means, said frequency selective impedances having values adapted to substantially preclude the application of energy from said excitation source to said connection means and adapted to prevent extraneous voltages between the signal electrodes.

References Cited in the file of this patent

UNITED STATES PATENTS

| | | |
|---|---|---|
| 1,418,022 | Reisz | May 30, 1922 |
| 1,604,986 | Garity | Nov. 2, 1926 |
| 2,027,399 | Ostermeier | Jan. 14, 1936 |
| 2,051,601 | Hobart | Aug. 18, 1936 |
| 2,051,609 | Langmuir | Aug. 18, 1936 |
| 2,051,623 | Tonks | Aug. 18, 1936 |
| 2,103,439 | Swart | Dec. 28, 1937 |
| 2,349,012 | Spaeth | May 16, 1944 |
| 2,525,768 | Bruns | Oct. 17, 1950 |
| 2,738,443 | Danziger | Mar. 13, 1956 |